(12) United States Patent
Cai et al.

(10) Patent No.: US 9,687,885 B2
(45) Date of Patent: Jun. 27, 2017

(54) MULTI-CYCLE WAFER CLEANING METHOD

(71) Applicant: Taiwan Semiconductor Manufacturing Co., Ltd., Hsin-Chu (TW)

(72) Inventors: Ying-Jie Cai, Hsinchu (TW); Bo-Wei Chou, Hsinchu (TW); Shih-Hsing Kao, Hsinchu (TW); Shin-Hsien Yang, Tainan (TW); Tzu-Min Lee, New Taipei (TW); Tai-Yung Yu, Tainan (TW); Wen-Cheng Lien, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/802,203

(22) Filed: Jul. 17, 2015

(65) Prior Publication Data

US 2017/0014871 A1    Jan. 19, 2017

(51) Int. Cl.
*B08B 3/00* (2006.01)
*B08B 3/02* (2006.01)
(Continued)

(52) U.S. Cl.
CPC .............. *B08B 3/02* (2013.01); *B08B 3/024* (2013.01); *B08B 3/08* (2013.01); *H01L 21/02052* (2013.01)

(58) Field of Classification Search
CPC .............. C23G 1/02; H01L 21/02041; H01L 21/02052; B08B 3/02
(Continued)

(56) References Cited

U.S. PATENT DOCUMENTS 6,324,715 B1 *  12/2001  Hymes ................... A46B 11/06
                                                        15/102
6,797,071 B2 *  9/2004   Kittle ................ H01L 21/67028
                                                         134/11
(Continued)

FOREIGN PATENT DOCUMENTS

CN    102069078    5/2011
CN    102091700    6/2011
(Continued)

OTHER PUBLICATIONS

Chinese language office action dated Mar. 25, 2016, issued in application No. TW 104139097.
(Continued)

*Primary Examiner* — Duy Deo
*Assistant Examiner* — Maki Angadi
(74) *Attorney, Agent, or Firm* — McClure, Qualey & Rodack, LLP (57) ABSTRACT

Methods for cleaning a wafer in semiconductor fabrication are provided. The method includes providing a wafer. The method further includes cleaning the wafer in a first cleaning cycle by supplying a cleaning solution and supplying a first washing liquid mixed with a purge gas in sequence. The method also includes cleaning the wafer in a second cleaning cycle by supplying the cleaning solution and a second washing liquid mixed with the purge gas in sequence. The second cleaning cycle is initiated after the first cleaning cycle is finished.

20 Claims, 11 Drawing Sheets

(51) Int. Cl.
*H01L 21/02* (2006.01)
*B08B 3/08* (2006.01)

(58) Field of Classification Search
USPC ............... 134/2, 3, 25.4, 26, 28, 29, 30, 34; 433/186
See application file for complete search history.

(56) References Cited

U.S. PATENT DOCUMENTS

| | | | |
|---|---|---|---|
| 7,503,334 B1 * | 3/2009 | Shrinivasan | B08B 7/0021 134/103.1 |
| 2008/0268617 A1 * | 10/2008 | Thakur | H01L 21/02052 438/458 |
| 2014/0007905 A1 | 1/2014 | Sun et al. | |
| 2015/0294855 A1 | 10/2015 | Rebstock | |
| 2015/0368794 A1 | 12/2015 | Morita et al. | |
| 2016/0067749 A1 | 3/2016 | Kabasawa et al. | |

FOREIGN PATENT DOCUMENTS

| | | |
|---|---|---|
| CN | 103182392 | 7/2013 |
| TW | 201400202 | 1/2014 |
| TW | 201402233 | 1/2014 |
| TW | 201443984 | 11/2014 |
| WO | WO 2014/184999 | 11/2014 |

OTHER PUBLICATIONS

Chinese language office action dated Oct. 14, 2016, issued in Application No. TW 104139097.

* cited by examiner

MULTI-CYCLE WAFER CLEANING METHOD

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form an integrated circuit (IC) and elements thereon. ICs in the newer generations have more complex circuits than ICs in the previous generations as technologies advance. However, for these advances to be realized, similar developments in IC processing and manufacturing are needed.

During the manufacturing of semiconductor devices, various processing steps are used to fabricate integrated circuits on a semiconductor wafer. One of the most difficult factors in the continuing evolution toward smaller device sizes and higher circuit density is to consistently form circuits with smaller critical dimensions within predetermined error windows. For example, semiconductor feature sizes are frequently subject to optical or electrical metrology inspections following photolithographic patterning and etching to ensure that critical dimensions are within acceptable limits.

Although existing methods and devices for performing the processing steps have been generally adequate for their intended purposes, they have not been entirely satisfactory in all respects. Consequently, it would be desirable to provide a solution for process control in semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1:
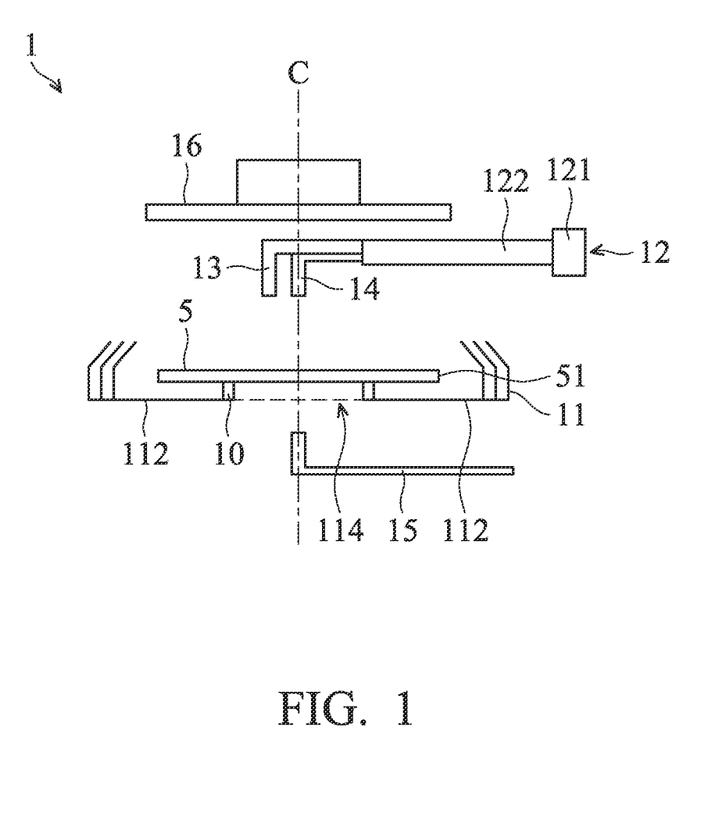
FIG. 1 is a schematic diagram of a processing system in semiconductor fabrication, in accordance with some embodiments.

FIG. 1 shows a schematic view of a processing system 1, in accordance with some embodiments. The processing system 1 is configured to clean one or more wafers 5. The wafer 5 may be made of silicon or other semiconductor materials. Alternatively or additionally, the wafer 5 may include other elementary semiconductor materials such as germanium (Ge). In some embodiments, the wafer 5 is made of a compound semiconductor such as silicon carbide (SiC), gallium arsenic (GaAs), indium arsenide (InAs), or indium phosphide (InP). In some embodiments, the wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the wafer 5 includes an epitaxial layer. For example, the wafer 5 has an epitaxial layer overlying a bulk semiconductor. In some other embodiments, the wafer 5 may be a silicon-on-insulator (SOI) or a germanium-on-insulator (GOI) substrate.

The wafer 5 may have various device elements. Examples of device elements that are formed in the wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or re-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the processing system 1 includes a wafer stage 10, a catch cup 11, a transferring module 12, a number of supply units, (such as a first supply unit 13, a second supply unit 14, a third supply unit 15), and a shield plate 16. Additional features can be added to the wafer process system, and some of the features described below can be replaced or eliminated in other embodiments of the wafer process system.

In some embodiments, the catch cup 11 is configured to provide an environment for cleaning the wafer 5. The catch cup 11 is a circular cup having an open top. The upper portion of the cup wall tilts inward to facilitate retaining waste within the catch cup 11. The catch cup 11 is connected to an exhaust system via a liquid waste drain formed on the bottom wall 112. As a result, the catch cup 11 is able to catch and drain waste liquid solution for the wafer cleaning process via the liquid waste drain.

In some embodiments, the catch cup 11 has an opening 114 formed on the bottom wall 112. The opening 114 allows the cleaning solution entering the inside of the catch cup 11 to wash the back surface of the wafer 5. The opening 114 is substantially located in the center of the catch cup 11. However, it should be appreciated that other variations and modifications can be made to embodiments of the disclosure.

The wafer stage 10 is disposed in the catch cup 11. In some embodiments, the wafer stage 10 is configured for holding, positioning, moving, rotating, and otherwise manipulating the wafer 5. In some embodiments, the wafer stage 10 is arranged to move along a main axis C. The wafer 5 may be secured on the wafer stage 10 by a clamping mechanism, such as vacuum clamping or e-chuck clamping. The wafer stage 10 is designed and configured to be operable for translational and rotational motions. In some embodiments, the wafer stage 10 is further designed to tilt or dynamically change the tilt angle. In some embodiments, the wafer stage 10 is fitted with a suitable heating mechanism to heat the wafer 5 to a desired temperature.

The transferring module 12 is configured to move the supply units. The transferring module 12 includes one or more driving elements 121, and a robot arm 122, in accordance with some embodiments. The driving element 121, such as a motor, is controlled by the control module and is coupled to the robot arm 122. The robot arm 122 is driven by the driving element to provide both radial and rotational movement in a fixed plane to move the first supply units 13 and 14 from one location within the processing system 1 to another.

For example, with the transferring module 12, the first and second supply units 13 and 14 are transferred from a peripheral region of the processing system 1 to a central region of the processing system 1. At the peripheral region, the first supply units 13 and 14 are not positioned above the wafer 5. At the center region, the first and second supply units 13 and 14 are positioned above the wafer 5. Namely, the projections of the outlets for supply cleaning material of the first supply units 13 and 14 are located above the wafer 5.

The shield plate 16 is positioned relative to the catch cup 11 and configured to supply liquid to wash the wafer 5 or discharge gas to dry the wafer 5. In some embodiments, the shield plate 16 is arranged to move along the main axis C. When the shield plate 16 is used to discharge gas, the shield plate 16 is lower to approach the wafer 5.

Figure 2:
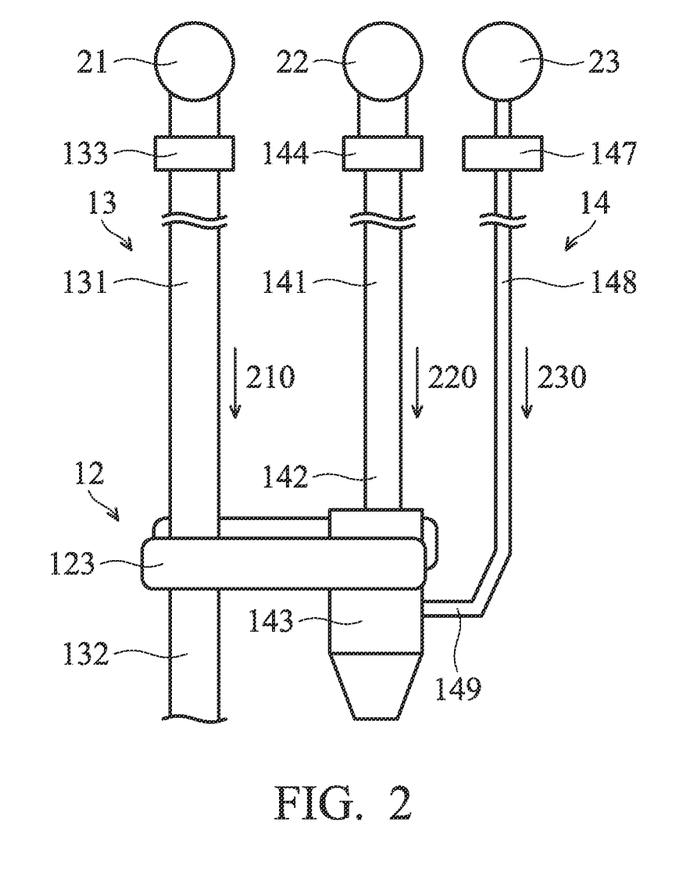
FIG. 2 is a schematic diagram of partial elements of processing system, in accordance with some embodiments.

FIG. 2 shows a schematic diagram of the first and second supply units 13 and 14, in accordance with some embodiments. Referring to FIG. 2, the first supply unit 13 is mounted on the transferring module 12 and configured to supply a cleaning solution 210 from the cleaning material source 21 to the wafer 5 (FIG. 1). In some embodiments, the first supply unit 13 includes a conduit 131 and a controller 133, and the transferring module 12 includes a bracket 123. One end of the conduit 131 is connected to a cleaning material source 21, and the other end of the conduit 131 is fixed at the bracket 123. The controller 133 is configured to control the connection and delivery rate of the cleaning solution 210 to the wafer 5. The controller 133 may include devices such as valves, flow meters, sensors, and the like.

In some embodiments, the cleaning solution 210 stored in the cleaning material source 21 includes an aggregate of two or more substances. Several examples of the mixture are described below. For example, the cleaning solution 210 is a SC1 solution mixed with substances including $NH_4OH$, $H_2O_2$, and $H_2O$ in a selected ratio. The SC1 solution may be used to clean the wafer and to remove the organic compound and particulate matter that attaches to the substrate surface. Alternatively, the cleaning solution 210 may be a SC2 solution, mixed with a substance including $HCl$, $H_2O_2$, and $H_2O$ in a selected ratio. The SC2 solution may be used to clean the wafer and to remove the metal dregs that attach to the wafer surface. However, it should be appreciated that many variations and modifications can be made to embodiments of the disclosure.

The second supply unit 14 is mounted on the transferring module 12 and configured to spray a washing liquid to the wafer 5 (FIG. 1). In some embodiments, the second supply unit 13 includes a conduit 141, a nozzle 143, a controller 144, a gas controller 147, and a gas line 148. The nozzle 143 is fixed on the bracket 123. One end of the conduit 141 is connected to a cleaning material source 22, and the other end 142 of the conduit 141 is connected to the nozzle 143. The end 142 of the conduit 141 is spaced from the end 132 of the conduit 131 by a predetermined distance. The controller 144 is configured to control the connection and delivery rate of the washing liquid 220 to the wafer 5. The controller 144 may include devices such as valves, flow meters, sensors, and the like.

In some embodiments, the washing liquid 220 stored in the cleaning material source 22 includes an aggregate of two or more substances. Several examples of the mixture are described below. For example, the washing liquid 220 is a SC1 solution. Alternatively, the washing liquid 220 stored may be a SC2 solution. In some embodiments, the washing liquid 220 stored in the cleaning material source 22 includes $CO_2$ water.

The gas line 148 is configured to deliver a gas 230 into the nozzle 143. In some embodiments, one end of the gas line 148 is connected to a gas source 23, and the other end 149 of the gas line 148 is connected to the nozzle 143. The controller 147 is configured to control the connection and delivery rate of the gas 230 to the wafer 5. The controller 147 may include devices such as valves, flow meters, sensors, and the like. In some embodiments, the gas 230 stored in the gas source 23 includes $N_2$ or other inert gas.

Figure 3:
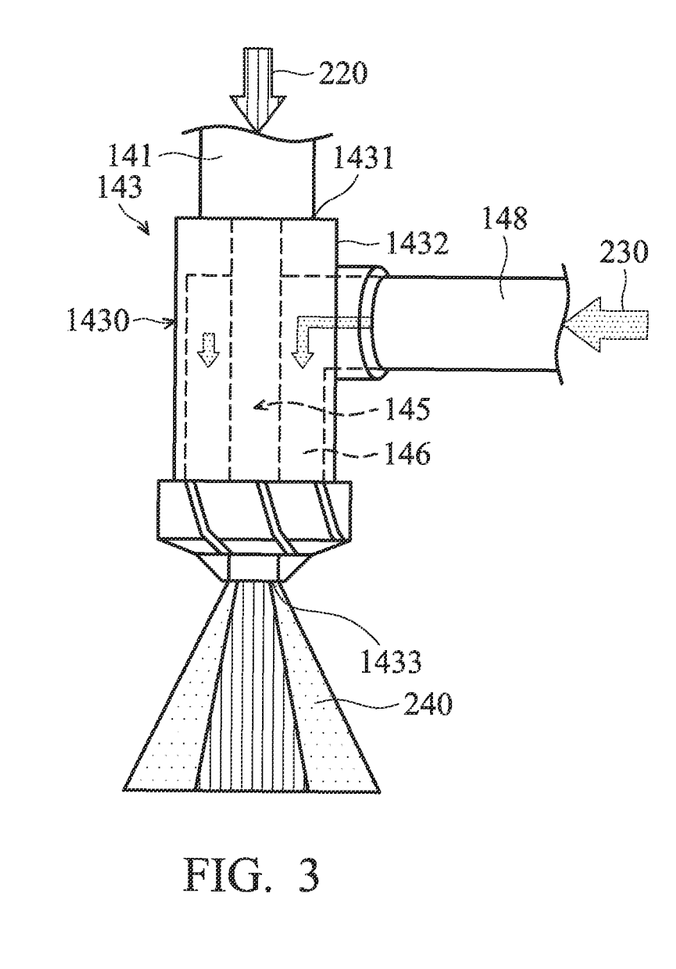
FIG. 3 is a schematic diagram of partial elements of a supply unit, in accordance with some embodiments.

FIG. 3 shows a schematic diagram of the nozzle 148, in accordance with some embodiments. Referring to FIG. 3, the nozzle 148 includes a main body 1430, and two flow paths 145 and 146 are formed in the main body 1430. One end of the flow path 145 is formed at the top surface 1431 of the main body 1430, and the other end of the flow path 145 is formed at the bottom surface 1433 of the main body 1430. The flow path 146 peripherally surrounds the flow path 145. One end of the flow path 146 is formed at the lateral surface 1432 of the main body 1430, and the other end of the flow path 146 is formed at the bottom surface 1433 of the main body 1430. The conduit 141 is connected to the end of the flow path 145 which is located at the top surface 1431. The gas line 148 is connected to the end of the flow path 146 which is located at the lateral surface 1432.

In some embodiments, as shown in FIG. 3, the washing liquid 220 converges with the gas 230 at the outlet of the nozzle 143 and transfers to washing spray 240. In some embodiments, near the end of the flow path 146 which is located at the bottom surface 1433, the width of the flow path 146 gradually decreases. This feature makes the gas 230 ejected from the nozzle 143 with a higher flowing speed than that of the gas 230 in the gas line 148. Mixed with the gas 230, the washing liquid 220 is converted to a washing spray 240 which includes fine droplets and ejected to the wafer 5 at a relatively high speed. As a result, the particles and contaminants on the wafer 5 are washed away by the washing spray 240 via physical force.

Figure 4:
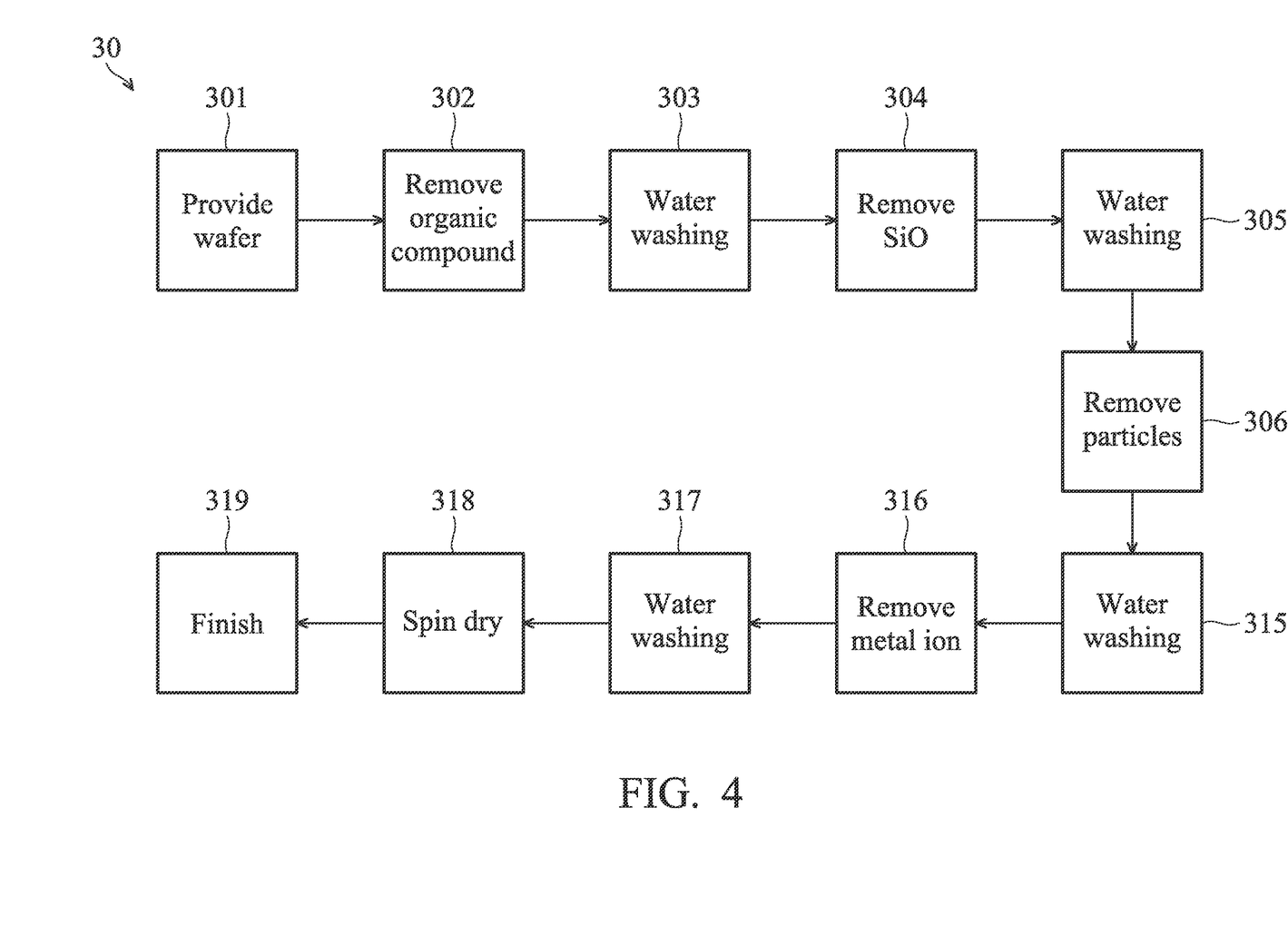
FIG. 4 is a flow chart of a method for cleaning a wafer, in accordance with some embodiments.

FIG. 4 is a flow chart illustrating a method 30 for cleaning a wafer, in accordance with some embodiments. For illustration, the flow chart will be described along with the schematic views shown in FIGS. 1-3. Some of the stages described can be replaced or eliminated for different embodiments.

The method 30 begins with an operation 301, in which a wafer (such as wafer 5), to be cleaned is delivered into a process system (such as process system 1). In operation 31, organic compound on the wafer 5 is removed by supplying, for example, ozone ($O_3$) to both the front and back surface of the wafer 5. In operation 32, the wafer 5 is washed by liquid, such as $CO_2$ water, so as to remove ozone used in operation 31. In operation 304, silicon dioxide ($SiO_2$) on the wafer 5 is removed by supplying, for example, Hydrogen fluoride (HF) to both the front and back surface of the wafer 5. In operation 305, the wafer 5 is once again washed by liquid, such as $CO_2$ water, so as to remove HF used in operation 305.

Figure 5:
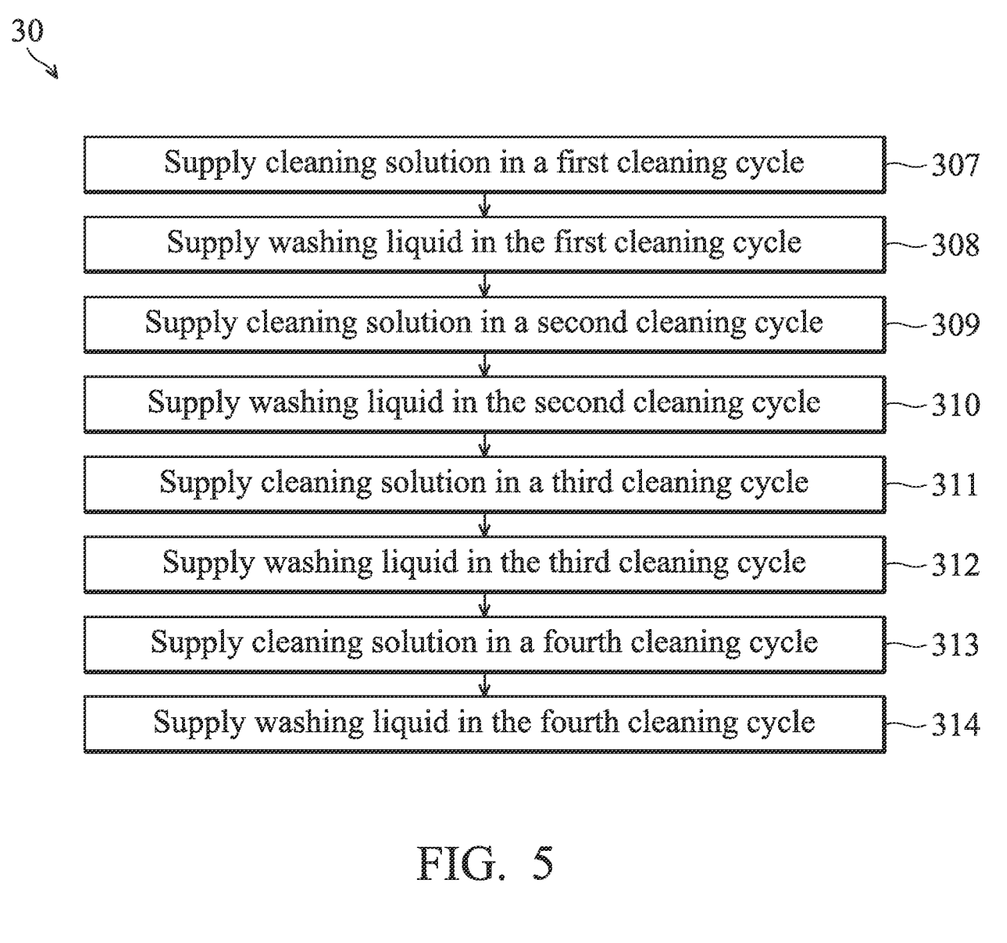
FIG. 5 is a flow chart of a method for supplying plasma material into a processing chamber, in accordance with some embodiments.

In operation 306, a multi-cycle cleaning process is performed so as to remove particles and/or contaminants on the wafer 5. The details of the multi-cycle cleaning process, in accordance with some embodiments, are shown in FIG. 5. For illustration, the flow chart will be described along with the schematic views shown in FIGS. 6-7.

Figure 6A:
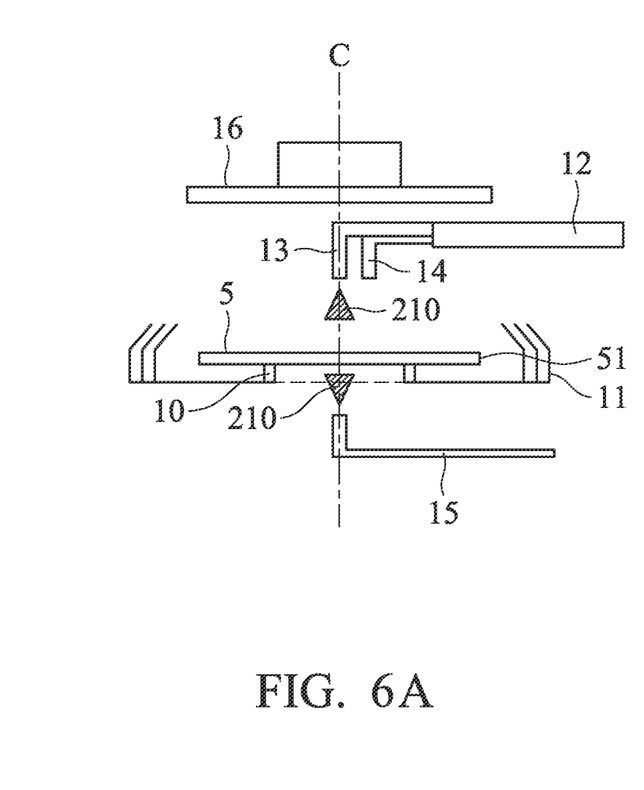
FIGS. 6A-6G are schematic diagrams of various stages of a process for removing particles and/or contaminants on the wafer surface, in accordance with some embodiments.

In some embodiments, as shown in FIG. 6A, the multi-cycle cleaning process begins with operation 307, in which a supply of a cleaning solution (such as cleaning solution 210) in a first cleaning cycle C1 is performed. In some embodiments, before the supply of the cleaning solution 210 in the first cycle C1, both the first supply unit 13 and the second supply unit 14 are moved by the transferring module 12 from a peripheral region to a central region of the processing system 1.

Figure 7:
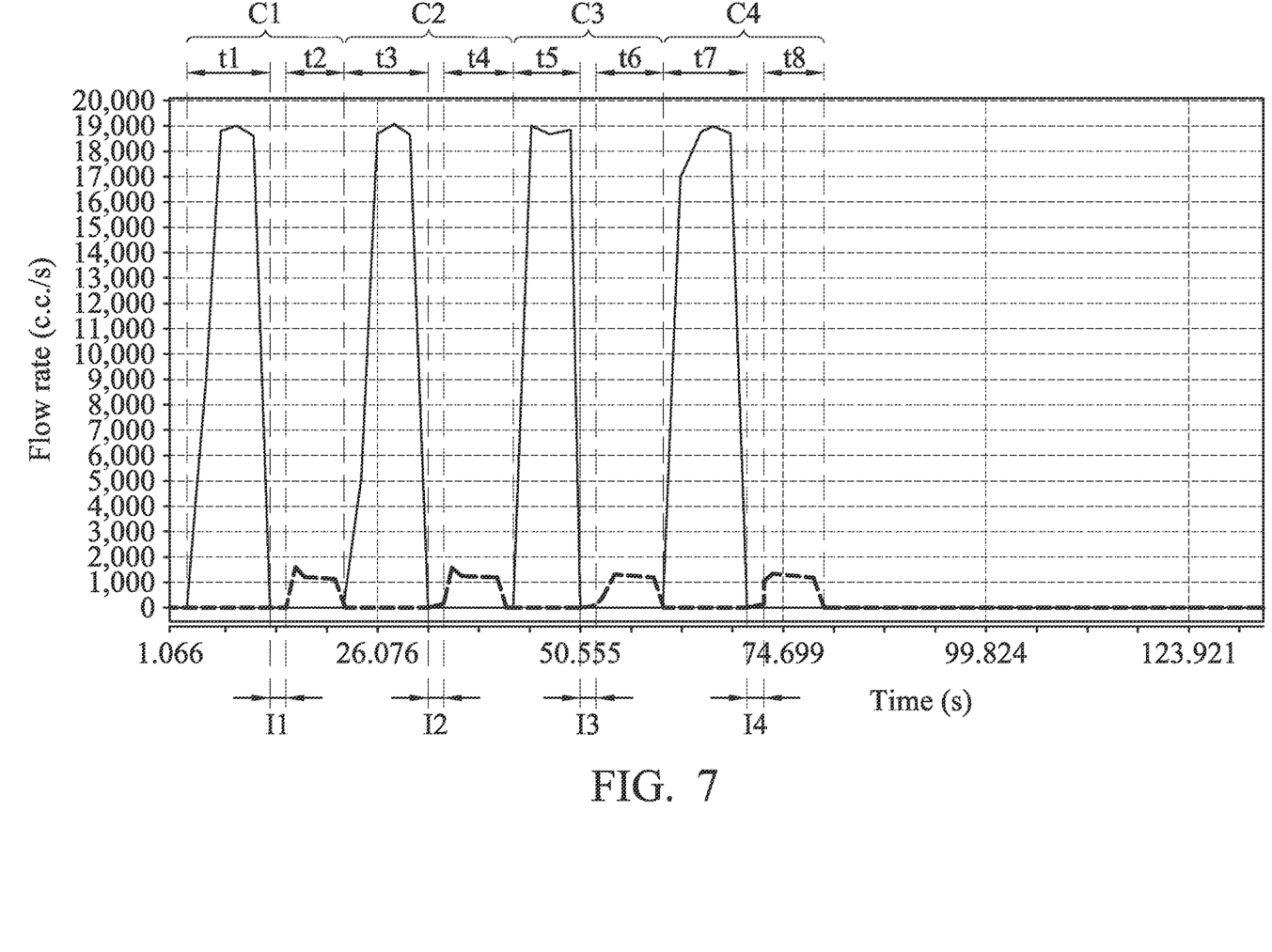
FIG. 7 illustrates a wafer cleaning timing diagram according to the method of FIG. 5.

In some embodiments, as shown in FIG. 6A, to supply the cleaning solution 210, the openings of the first supply unit 13 and the third supply unit 15 for discharging are positioned to align with the axis C which passes through the center of the wafer 5. In some embodiments, during the supply of the cleaning solution 210, the wafer 5 is rotated by the wafer stage 10 at a predetermined rotating speed. As a result, the cleaning solution 210 from the first supply unit 13 is evenly distributed over the front surface of the wafer 5. In some embodiments, chemical reactions between the cleaning solution 210 and the residuals on the wafer 5 occur as the cleaning solution 210 is supplied over the wafer 5. As a result, the wafer 5 is cleaned, particles on the wafer 5 is removed. In some embodiments, the operation 307 is performed for a first period of time t1 (FIG. 7). The first period of time t1 may be in a range from about 3.7 seconds to about 4 seconds.

Figure 6B:
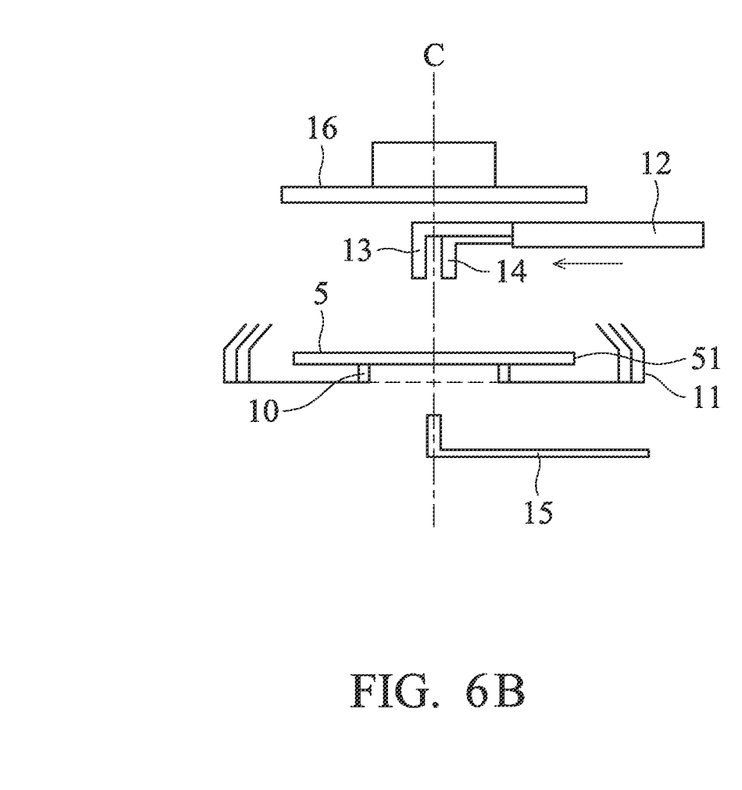
Figure 6C:
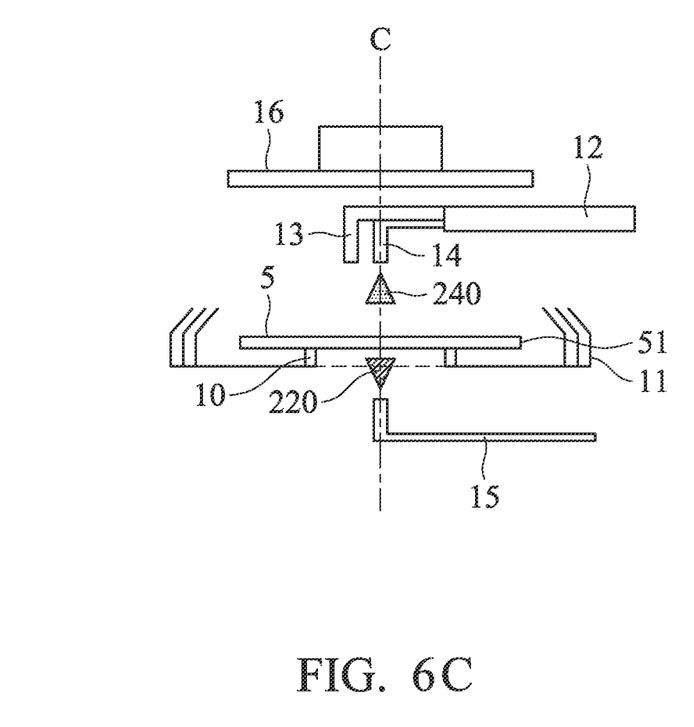
Figure 6D:
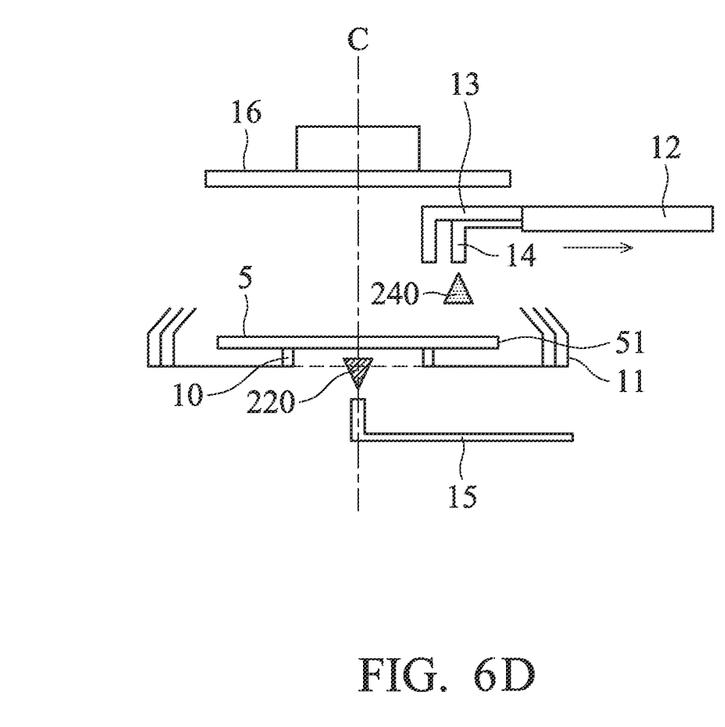

In operation 308, a supply of a washing liquid (such as washing liquid 220) mixed with a purge gas (such as gas 230) in the first cleaning cycle C1 is performed. In some embodiments, as shown in FIG. 6B, before the supply of the washing spray 240, both of the first supply unit 13 and the second supply unit 14 are moved by the transferring module 12 along the direction indicated by the arrow shown in FIG. 6B. The movement is stopped when the nozzle 143 (FIG. 2) aligns with the center of the wafer 5, as shown in FIG. 6C. The movement is completed within a predetermined idle time I1 (FIG. 7). The idle time I1 may be 0.3 seconds.

In some embodiments, as shown in FIG. 6C, in the beginning of the operation 308, the openings of the second supply unit 14 and the third supply unit 15 for discharging are positioned to align with the axis C which passes through the center of the wafer 5. The washing spray 240 is supplied over the center of front surface of the wafer 5, and the washing liquid 220 is supplied over the center of the back surface of the wafer 5. In some other embodiments, the washing spray 240 is supplied over both the front and back surfaces of the wafer 5.

Figure 6E:
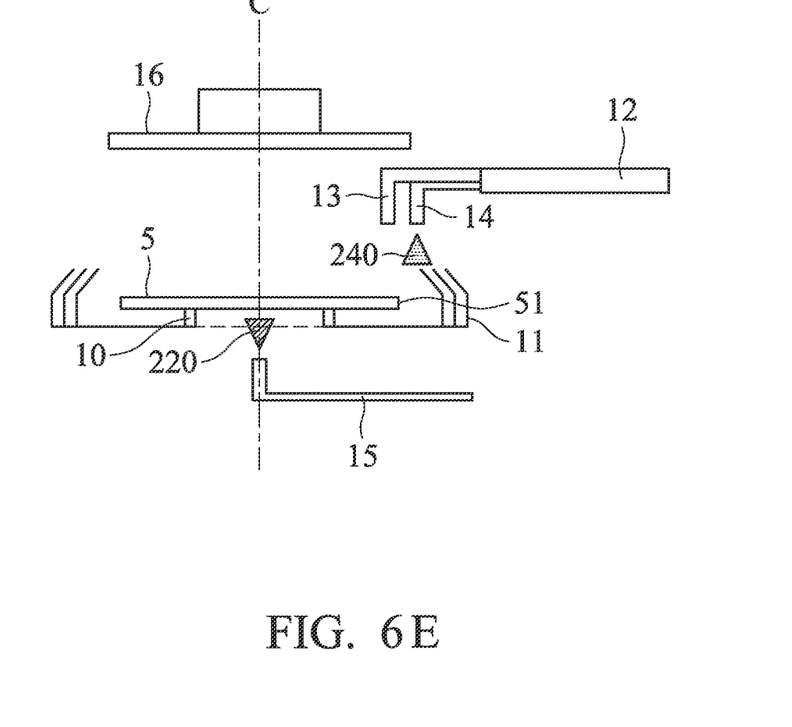

Afterwards, both the first supply unit 13 and the second supply unit 14 are moved by the transferring module 12 along the direction indicated by the arrow shown in FIG. 6C. During the movement, the washing spray 240 is continuously supplied over the wafer 5. In some embodiments, the movement is stopped as the opening of the second supply unit 14 aligns with the edge 51 of the wafer 5, as shown in FIG. 6E. However, it should be appreciated that other variations and modifications can be made to embodiments of the disclosure. In some other embodiments, when the outermost edge of the wafer 5 is supplied with the washing spray 240, the movement is stopped.

Figure 6F:
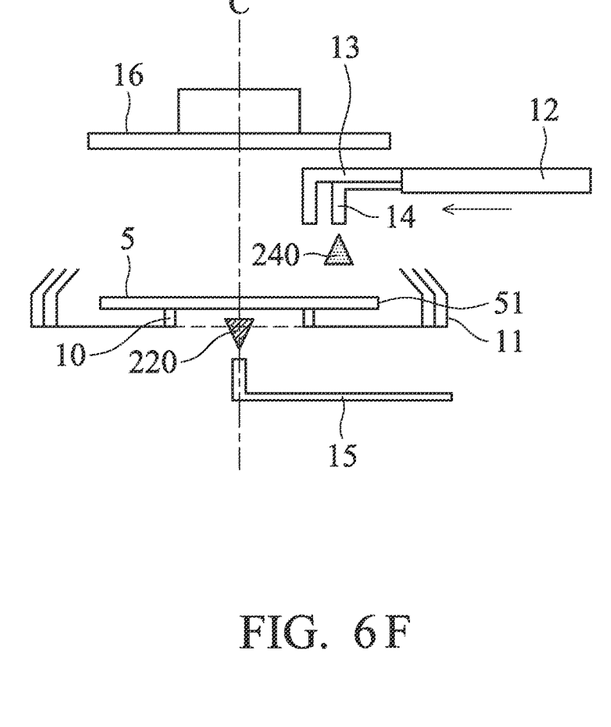
Figure 6G:
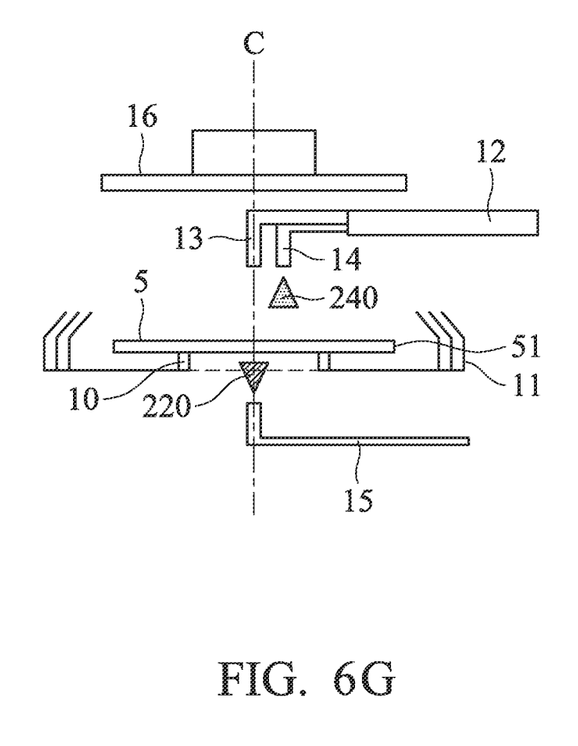

Afterwards, both the first supply unit 13 and the second supply unit 14 are moved by the transferring module 12 along the direction indicated by the arrow shown in FIG. 6F. In some embodiments, the movement is stopped as the opening of the first supply unit 13 aligns with the center of the wafer 5, as shown in FIG. 6G, and the operation 308 is completed. In the end of the operation 308, the opening of the second supply unit 14 is not positioned to align with the center of the wafer 5. In some embodiments, the operation 308 is performed for a second period of time t2 (FIG. 7). The second period of time t2 may be 4 seconds.

In some embodiments, during the movement, the wafer 5 is rotated by the wafer stage 10 at a predetermined rotating speed. Therefore, in the movement of the second supply unit 14 in the operation 308, the entire front surface of the wafer 5 is cleaned by the second supply unit 14 in spite of the fact that the small area of the wafer surface can be directly washed by the washing spray 240.

Figure 8:
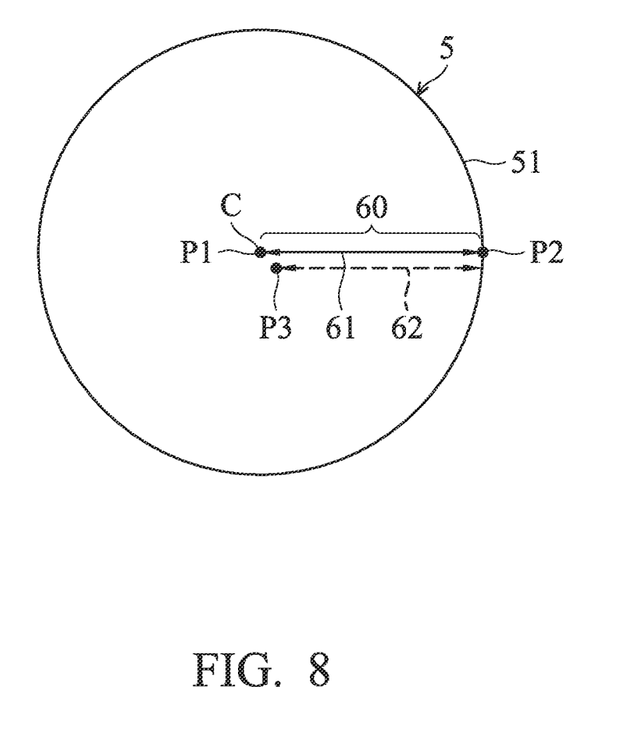
FIG. 8 illustrates are schematic diagrams of stages of a process for moving a supply unit during the supply of a washing spray, in accordance with some embodiments.

Referring to FIG. 8, in some embodiments, the second supply unit 14 is moved along a predetermined path 60 in the duration of the washing spray 240 being supplied. The predetermined path 60 initiates at a first position P1 located in a vicinity of the center of the wafer 5, and passes a second position P2 located in a vicinity of the edge 51 of the wafer 5, and terminates at a third position located P3 in a vicinity of the center C of the wafer. In some embodiments, the predetermined path 60 includes a first segment 61 and a second segment 62. The first segment 61 is a straight line extending from the center of the wafer 5 to the edge 51 of the wafer 5. The second segment 62 is also a straight line extending from the edge 51 of the wafer to a position near the center of the wafer 5. The first segment 61 may overlap the second segment 62. In some embodiments, the first and second segments 61 and 62 are curved lines.

It is appreciated that while in the above embodiments, the first supply unit 13 and the second supply unit 14 are simultaneously moved by the transferring module 12, the disclosure should not be limited thereto. The first supply unit 13 and the second supply unit 14 may be driven to move independently.

In some embodiments, after the operation 308 is finished, the operations 307 and 308 are alternately repeated three times. Specifically, as shown in FIG. 7, in operation 309, a supply of the cleaning solution 210 in a second cleaning cycle C2 is performed for a third period of time t3. In operation 310, a supply of the washing spray 240 in the second cleaning cycle C2 is performed for a fourth period of time t4. An idle time 12 may be set between the operations 309 and 310. In operation 311, a supply of the cleaning solution 210 in a third cleaning cycle C3 is performed for a fifth period of time t5. In operation 312, a supply of the washing spray 240 in the third cleaning cycle C3 is performed for a sixth period of time t6. An idle time 13 may be set between the operations 311 and 312. In operation 313, a supply of the cleaning solution 210 in a fourth cleaning cycle C4 is performed for a seventh period of time t7. In operation 314, a supply of the washing spray 240 in the fourth cleaning cycle C4 is performed for an eighth period of time t8. An idle time 14 may be set between the operations 313 and 314.

In some embodiments, the first, second, third, and fourth cleaning cycles C1-C4 occur sequentially. The supply of the cleaning solution 210 and the supply of the washing spray 240 are alternately performed for a relatively short time (such as 8 seconds). For example, the supply of the cleaning solution 220 in the first cleaning cycle C1, the supply of the washing spray 240 in the first cleaning cycle C1, the supply of the cleaning solution 220 in the second cleaning cycle C2, and the supply of the washing spray 240 in the second cleaning cycle C2 are performed in sequence.

In some embodiments, the operations 309, 311, and 313 are similar to the operation 307, and the operations 310, 312, and 314 are similar to the operation 308. Therefore, details of these operations 309-314 are omitted for the purpose of brevity. However, it should be appreciated that other variations and modifications can be made to embodiments of the disclosure.

In some embodiments, the content of the washing spray 240 in different cleaning cycles is varied. For example, the washing spray 240 in the operation 308 includes a first washing liquid, such as SC1 solution, and nitrogen gas, and the washing spray 240 in the operations 310, 312, and 314 includes a second washing liquid, such as $CO_2$ water, and nitrogen gas.

In some embodiments, the time for supplying the cleaning solution 210 in each cleaning cycle is less than the time for supplying the cleaning solution 210 in the previous cleaning cycle. For example, the third period of time t3 is less than first period of time t1. In some embodiments, the time for supplying the washing spray 240 in each cleaning cycle is less than the time for supplying the washing spray 240 in the previous cleaning cycle. For example, the fourth period of time t4 is less than the second period of time t2. By reducing processing time, productivity is increased. In some embodiments, to decrease the time for supplying the washing spray 240, the moving speed of the transferring module 12 is increased so that the second supply unit 14 is moved faster. For example, the moving speed of the second supply unit 14 in a second cleaning cycle C2 is greater than the moving speed of the second supply unit 14 in a first cleaning cycle C1.

In some embodiments, the flow rate (delivery rate) of the cleaning solution 210 to the wafer 5 in each cleaning cycle is different from that in the previous cleaning cycle. For example, the flow rate of the cleaning solution 210 to the wafer 5 in the second cleaning cycle C2 is less than the flow rate of the cleaning solution 210 to the wafer 5 in the first cleaning cycle C1. In some embodiments, the flow rate of the washing liquid 220 to the wafer 5 in each cleaning cycle is different from that in the previous cleaning cycle. For example, a flow rate of the washing liquid 220 to the wafer 5 in the second cleaning cycle C2 is less than a flow rate of the washing liquid 220 to the wafer 5 in the first cleaning cycle C1. By reducing the use of the cleaning solution 210 and the washing liquid 220, the cost for cleaning the wafer 5 is decreased, and the waste liquid generated in the cleaning process is also decreased.

In some embodiments, the flow rate of the purge gas 230 to the wafer 5 in each cleaning cycle is different from that in the previous cleaning cycle. For example, a flow rate of the purge gas 230 to the wafer 5 in the second cleaning cycles is larger than a flow rate of the purge gas 230 to the wafer 5 in the first cleaning cycles.

In operation 315, the wafer 5 is once again washed by liquid, such as $CO_2$ water, so as to remove the cleaning solution 210 and the washing spray 240 used in operation 306. In operation 316, metal ions on the wafer 5 are removed by supplying, for example, SC2 solution to both the front and back surface of the wafer 5. In some embodiments, the operation 316 includes multi-cycle cleaning process as the performed in the operation 306. The SC2 solution and a washing spray are alternatively supplied over the wafer for multiple times.

In operation 317, the wafer 5 is once again washed by liquid, such as $CO_2$ water, so as to remove the SC2 solution used in operation 316. The liquid may be supplied from the shield plate 16. In operation 318, the wafer 5 is dried by spinning the wafer 5 and dry gas, such as nitrogen gas, is supplied over the wafer 5 from the shield plate 16. The shield plate 16 may be lowered to close the wafer 5 as the supplying of the dry gas. The method 30 continues with operation 319 where the cleaning of the wafer 5 is completed.

Embodiments of cleaning wafer in a semiconductor fabrication described above use a multi-cycle cleaning process to remove particles or contaminants on the wafer. In the multi-cycle cleaning process, the wafer is alternately cleaned by a cleaning solution and a washing spray (a washing liquid mixed with gas) multiple times. Compared with a method in which the cleaning solution and the washing liquid are supplied for a longer time but only performed once, a higher cleaning efficiency is achieved by the multi-cycle cleaning process. In addition, the same cleaning efficiency can be achieved even if the total processing time for cleaning the wafer is reduced, and therefore productivity is increased. Moreover, since the cleanliness of the wafer is ensured, the production yield is improved.

In accordance with some embodiments, a method for cleaning a wafer is provided. The method includes providing the wafer. The method further includes performing a cleaning cycle over the wafer multiple times. Each of the cleaning cycles includes supplying a cleaning solution over the wafer and supplying a washing liquid mixed with a purge gas over the wafer.

In accordance with some embodiments, a method for cleaning a wafer is provided. The method includes providing the wafer. The method further includes cleaning the wafer in a first cleaning cycle by supplying a cleaning solution and supplying a first washing liquid mixed with a purge gas in sequence. The method also includes cleaning the wafer in a second cleaning cycle by supplying the cleaning solution and a second washing liquid mixed with the purge gas in sequence. The second cleaning cycle is initiated after the first cleaning cycle is finished.

In accordance with some embodiments, a method for cleaning a wafer is provided. The method includes providing a wafer. The method further includes cleaning the wafer by performing a cleaning cycle multiple times. The cleaning cycle includes supplying a cleaning solution over the wafer via a first supply unit. The cleaning cycle further includes supplying a washing liquid mixed with a purge gas over the wafer via a second supply unit. The cleaning cycle also includes moving the second supply unit along a predetermined path in the duration of the washing liquid being supplied. The predetermined path initiates at a first position located in a vicinity of the center of the wafer, and passes a second position located in a vicinity of an edge of the wafer, and terminates at a third position located in a vicinity of the center of the wafer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   providing a wafer; and
   performing a cleaning cycle over the wafer multiple times, wherein each of the cleaning cycles comprises supplying a cleaning solution over the wafer and supplying a washing liquid mixed with a purge gas over the wafer which is coated with the cleaning solution.

2. The method as claimed in claim 1, wherein each of the cleaning cycles are preformed successively, and the supply of the cleaning solution and the supply of the washing liquid in two sequential cleaning cycles are alternately performed.

3. The method as claimed in claim 1, wherein each of the cleaning cycles takes the same amount of time to perform.

4. The method as claimed in claim 1, wherein a flow rate of the cleaning solution to the wafer in a second of the cleaning cycles is less than a flow rate of the cleaning solution to the wafer in a first of the cleaning cycles, wherein the second of the cleaning cycles is initiated after the conclusion of the first of the cleaning cycles.

5. The method as claimed in claim 1, wherein a time interval for supplying the cleaning solution in a second of the cleaning cycles is less than a time interval for supplying the cleaning solution in a first of the cleaning cycles, wherein the second of the cleaning cycles is initiated after the conclusion of the first of the cleaning cycles.

6. The method as claimed in claim 1, wherein a time interval for supplying the washing liquid in a second of the cleaning cycles is less than a time interval for supplying the washing liquid in a first of the cleaning cycles, wherein the second of the cleaning cycles is initiated after the conclusion of the first of the cleaning cycles.

7. The method as claimed in claim 1, wherein an idle time is set between the supply of the cleaning solution and the supply of the washing liquid, and a supply unit for supplying the washing liquid is moved to the predetermined position during the idle time.

8. The method as claimed in claim 1, wherein the washing liquid is supplied back and forth along the radial direction of the wafer.

9. A method comprising:
   providing a wafer;
   cleaning the wafer in a first cleaning cycle by supplying a cleaning solution and supplying a first washing liquid mixed with a purge gas over the wafer which is coated with the cleaning solution in sequence; and
   cleaning the wafer in a second cleaning cycle by supplying the cleaning solution and supplying a second washing liquid mixed with the purge gas over the wafer which is coated with the cleaning solution in sequence, wherein the second cleaning cycle is initiated after the first cleaning cycle is finished.

10. The method as claimed in claim 9, wherein the supply of the first washing liquid, the supply of the cleaning solution in the second cleaning cycle, and the supply of the second washing liquid are performed in sequence.

11. The method as claimed in claim 9, wherein each of the first and second cleaning cycles takes the same amount of time to perform.

12. The method as claimed in claim 9, wherein a flow rate of the cleaning solution to the wafer in the second cleaning cycle is less than a flow rate of the cleaning solution to the wafer in the first cleaning cycle.

13. The method as claimed in claim 9, wherein a time interval for supplying the cleaning solution in the second cleaning cycle is less than a time interval for supplying the cleaning solution in the first cleaning cycle.

14. The method as claimed in claim 9, wherein a time interval for supplying the second washing liquid in the second cleaning cycle is less than a time interval for supplying the first washing liquid in the first cleaning cycle.

15. The method as claimed in claim 9, wherein an idle time is set in the first cleaning cycle between the supply of the cleaning solution and the supply of the first washing liquid, and a supply unit for supplying the first washing liquid is moved to the first predetermined position during the idle time during the idle time.

16. The method as claimed in claim 9, wherein the first washing liquid is supplied back and forth along the radial direction of the wafer.

17. A method comprising:
   providing a wafer; and
   cleaning the wafer by performing a cleaning cycle multiple times, wherein the cleaning cycle comprises:
   supplying a cleaning solution over the wafer via a first supply unit;
   supplying a washing liquid mixed with a purge gas over the wafer via a second supply unit; and
   moving the second supply unit along a predetermined path in the duration of the washing liquid being supplied, wherein the predetermined path initiates at a first position located in a vicinity of the center of the wafer, and passes a second position located in a vicinity of an edge of the wafer, and terminates at a third position located in a vicinity of the center of the wafer.

18. The method as claimed in claim 17, wherein the supply of the cleaning solution and the supply of the washing liquid in two sequential cleaning cycles are alternately performed.

19. The method as claimed in claim 17, wherein a moving speed of the second supply unit in a second cleaning cycle is greater than a moving speed of the second supply unit in a first cleaning cycle.

20. The method as claimed in claim 17, wherein the supply of the cleaning solution in a second of the cleaning cycles is initiated when the second supply unit is moved to the third position in the first cleaning cycle.

\* \* \* \* \*